United States Patent
Lee et al.

(10) Patent No.: US 9,007,291 B2
(45) Date of Patent: Apr. 14, 2015

(54) ACTIVE LEVEL SHIFT DRIVER CIRCUIT AND LIQUID CRYSTAL DISPLAY APPARATUS INCLUDING THE SAME

(75) Inventors: Seung-Kyu Lee, Yongin (KR); Dong-Hoon Lee, Yongin (KR); Chul-Ho Kim, Yongin (KR); Kyung-Hoon Kim, Yongin (KR); Se-Hyang Kim, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 246 days.

(21) Appl. No.: 13/278,042

(22) Filed: Oct. 20, 2011

(65) Prior Publication Data

US 2012/0098807 A1 Apr. 26, 2012

(30) Foreign Application Priority Data

Oct. 22, 2010 (KR) .................. 10-2010-0103671

(51) Int. Cl.
G09G 3/36 (2006.01)
H03K 19/0185 (2006.01)

(52) U.S. Cl.
CPC ............ *G09G 3/3655* (2013.01); *G09G 3/3614* (2013.01); *G09G 2300/0876* (2013.01); *H03K 19/018507* (2013.01)

(58) Field of Classification Search
CPC ............... G09G 3/3406; G09G 2300/0456; G09G 2320/103; G09G 2360/144; G09G 3/3648; G09G 2300/0804; G09G 2310/0235; G09G 2320/0233; G09G 2320/0247; G09G 2330/021; G09G 2340/0435; G09G 3/294; G09G 3/36; G09G 2300/0443; G09G 2310/0259; G09G 2310/027; G09G 2310/0281; G09G 2310/0297; G09G 2310/066; G09G 2310/08; G09G 2330/022; G09G 3/00; G09G 3/002; G09G 3/20; G09G 3/2018; G09G 3/2025; G09G 3/3283; G09G 3/34; G09G 3/3413; G09G 3/3607; G09G 3/3659; G09G 3/3688; G09G 5/399
USPC ......................... 345/53, 54, 87–104, 204–214
See application file for complete search history.

(56) References Cited

U.S. PATENT DOCUMENTS

| | | | |
|---|---|---|---|
| 6,563,744 B2 * | 5/2003 | Kuroki | 365/189.05 |
| 6,963,335 B2 * | 11/2005 | Tanaka et al. | 345/204 |
| 8,362,995 B2 * | 1/2013 | Hsieh et al. | 345/90 |
| 2002/0141245 A1 * | 10/2002 | Kuroki | 365/189.05 |
| 2007/0164957 A1 * | 7/2007 | Hsieh et al. | 345/90 |
| 2007/0182680 A1 | 8/2007 | Jeon | |

(Continued)

FOREIGN PATENT DOCUMENTS

| | | | |
|---|---|---|---|
| KR | 10-2005-0096669 A | 10/2005 | |
| KR | 10-2007-0060752 A | 6/2007 | |
| KR | 10-2007-0078166 A | 7/2007 | |

*Primary Examiner* — Amare Mengistu
*Assistant Examiner* — Gloryvid Figueroa-Gibson
(74) *Attorney, Agent, or Firm* — Knobbe Martens Olson & Bear LLP

(57) ABSTRACT

An active level shift (ALS) driver circuit and a liquid crystal display apparatus including the ALS driver circuit are disclosed. The ALS driver circuit includes an input unit configured to apply a first polarity voltage to a first node and to apply a second polarity voltage to a second node, a level compensation unit configured to adjust the voltages of the first node and the second node, and an output unit configured to alternately output a first power voltage and a second power voltage according to the adjusted voltages of the first and second nodes.

18 Claims, 10 Drawing Sheets

(56) References Cited

U.S. PATENT DOCUMENTS

2008/0018578 A1* 1/2008 Ku .................. 345/90
2008/0048755 A1* 2/2008 Cho et al. ............ 327/333
2008/0291339 A1* 11/2008 Mamba et al. ........ 348/739
2008/0297449 A1* 12/2008 Yamashita et al. ...... 345/76
2009/0102820 A1* 4/2009 Chen et al. .......... 345/204
2009/0303210 A1* 12/2009 Nishimura ........... 345/204
2010/0166136 A1* 7/2010 Tobita ............... 377/67
2010/0201666 A1* 8/2010 Tobita ............... 345/208
2010/0315403 A1* 12/2010 Kaneyoshi et al. ...... 345/211
2010/0328300 A1* 12/2010 Kim et al. ........... 345/213

* cited by examiner

ACTIVE LEVEL SHIFT DRIVER CIRCUIT AND LIQUID CRYSTAL DISPLAY APPARATUS INCLUDING THE SAME

CROSS-REFERENCE TO RELATED APPLICATIONS

This application claims the benefit of Korean Patent Application No. 10-2010-0103671, filed on Oct. 22, 2010, in the Korean Intellectual Property Office, the disclosure of which is incorporated herein in its entirety by reference.

BACKGROUND

1. Field

The technology relates to a liquid crystal display apparatus, and more particularly to, an active level shift (ALS) driver circuit and a liquid crystal display apparatus including the ALS driver circuit.

2. Description of the Related Technology

Liquid crystal displays (LCDs) are widely used as displays for devices such as notebook computers or a portable TV sets, due to their light weight, thinness, and low power consumption.

An LCD apparatus generally includes upper and lower substrates with pixel electrodes and a common electrode and a liquid crystal layer disposed between the upper and lower substrates. The pixel electrodes are disposed in a matrix, connected to switching devices, such as thin film transistors (TFTs), and receive a data voltage for columns corresponding to the pixel electrode. The common electrode is formed over an entire surface of a display plate and receives a common voltage.

The LCD apparatus includes a gate driver and an active level shifter (ALS) driver and displays a desired image by adjusting quantities of transmitted light according to signals from the gate driver and the ALS driver applied to the pixels.

SUMMARY OF CERTAIN INVENTIVE ASPECTS

One inventive aspect is an active level shift (ALS) driver including a plurality of ALS driving circuits. Each of the plurality of ALS driving circuits includes an input unit configured to apply a first polarity voltage to a first node, and to apply a second polarity voltage to a second node. Each ALS driving circuit also includes a reset unit configured to apply an initial voltage to the first node and the second node, a level compensation unit configured to adjust the voltages of the first node and the second node, and an output unit configured to alternately output a first power voltage and a second power voltage according to the first polarity voltage and the second polarity voltage.

Another inventive aspect is a liquid crystal display apparatus including a data driver connected to a plurality of data lines and configured to apply data signals to the plurality of data lines, a gate driver connected to a plurality of gate lines and configured to sequentially apply gate signals to the plurality of gate lines, and an ALS driver including a plurality of ALS driving circuits connected to a plurality of ALS lines in parallel with the plurality of gate lines. Each of the ALS driving circuits includes first and second nodes, and an input unit configured to apply a first polarity voltage to the first node and to apply a second polarity voltage to the second node. Each ALS driving circuit also includes a level compensation unit configured to adjust the voltages of the first node and the second node, and an output unit configured to alternately output a first power voltage and a second power voltage according to the adjusted voltages of the first and second nodes.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF CERTAIN INVENTIVE EMBODIMENTS

Figure 1:
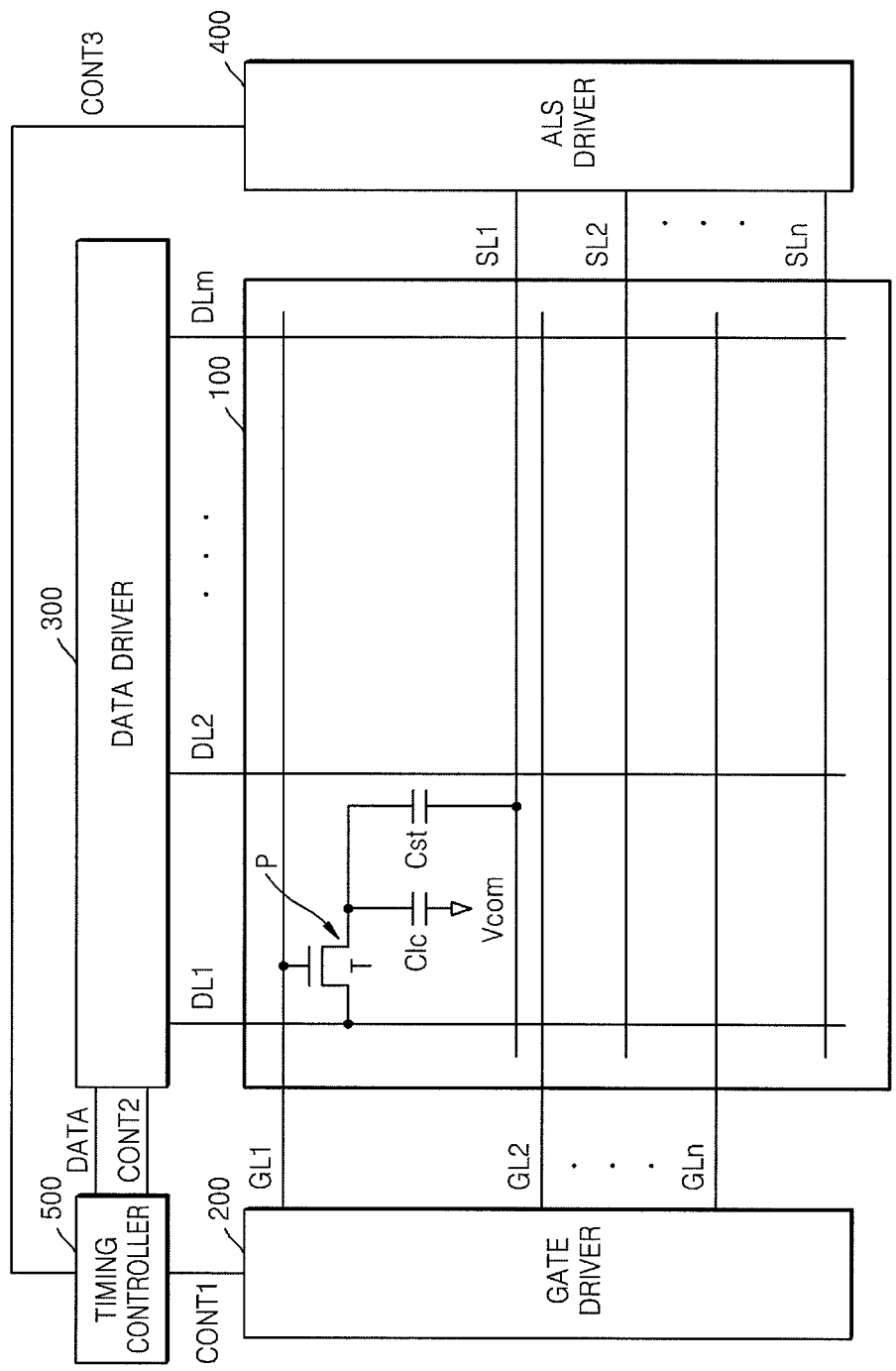
FIG. 1 is a schematic circuit diagram of a liquid crystal display apparatus according to an embodiment.

Hereinafter, various aspects are described more fully with reference to the accompanying drawings, in which exemplary embodiments are shown. In order to more clearly describe various features and aspects, detailed descriptions of certain functions or configurations may be omitted. Like reference numerals in the drawings generally denote like elements. In the accompanying drawings, thicknesses and sizes of layers and regions are in some instances exaggerated for clarity.

FIG. 1 is a schematic circuit diagram of a liquid crystal display apparatus according to an embodiment. Referring to FIG. 1, the liquid crystal display apparatus includes a liquid crystal panel 100, a gate driver 200, a data driver 300, an active level shift (ALS) driver 400, and a timing controller 500.

The liquid crystal panel 100 includes a liquid crystal layer between two substrates. The liquid crystal panel 100 includes a plurality of gate lines GL1 through GLn that are spaced apart from each other by a uniform pitch in a column direction, and a plurality of data lines DL1 through DLm that are spaced apart from each other by a uniform pitch in a row direction. A pixel P is formed at each intersection of the gate lines GL1 through GLn and the data lines DL1 through DLm.

The pixels P each include a thin film transistor (TFT) T, a liquid crystal capacitor Clc, and a storage capacitor Cst.

The TFT T includes a gate electrode connected to one of the gate lines GL1 through GLn, a first electrode connected to one of the data lines DL1 through DLm, and a second electrode connected to a pixel electrode. The TFT T is turned on if a gate on voltage is applied to the gate electrode, and transfers a data voltage applied from the data line connected to the first electrode to the pixel electrode.

The liquid crystal capacitor Clc is connected to the TFT T and an electric field is formed in the liquid crystal capacitor Clc between the pixel electrode formed on a lower substrate and a common electrode of an upper substrate. When a data voltage is applied to the pixel electrode, and a common voltage Vcom is applied to the common electrode from a common voltage line, the liquid crystal capacitor Clc adjusts or blocks transmission of light according to a change in an arrangement of liquid crystal molecules due to the electric field of the liquid crystal capacitor Clc. The common electrode may alternatively be formed on the lower substrate. In this case, at least one of the pixel electrode and the common electrode may have a linear or bar shape.

The storage capacitor Cst includes the pixel electrode and an electrode that is connected to one of a plurality of ALS lines SL1 through SLn in parallel to the gate lines GL1 through GLn. The storage capacitor Cst maintains a data voltage stored in the liquid crystal capacitor Clc until a next data voltage is stored.

The gate driver 200 may generate gate signals having a combination of a gate on voltage of an active level and a gate off voltage of a non-active level and sequentially provide the liquid crystal panel 100 with the gate signals through the gate lines GL1 through GLn. The TFT T is turned on by the gate on voltage or turned off by the gate off voltage. The gate driver 200 includes a plurality of gate circuits. The gate circuits include odd numbered gate driver circuits for outputting the gate signals G1, G3, G5, . . . to the odd numbered gate lines GL1, GL3, GL5, . . . , and even numbered gate driver circuits for outputting the gate signals G2, G4, G6, . . . to the even numbered gate lines GL2, GL4, GL6, . . . .

The data driver 300 may sequentially provide the liquid crystal panel 100 with data signals through the data lines DL1 through DLm. The data driver 300 converts input image data DATA having a grayscale input from the timing controller 500 into a voltage or current data signal.

The ALS driver 400 may sequentially provide the liquid crystal panel 100 with ALS voltages through the ALS lines SL1 through SLn. The ALS lines SL1 through SLn are spaced apart from each other by a uniform pitch, are parallel to the gate lines GL1 through GLn, and alternate with the gate lines GL1 through GLn. According to some embodiments, the ALS driver 400 may be in parallel with the data lines DL1 through DLm or may be in an edge region of the pixel electrode.

The ALS driver 400 outputs an ALS voltage of a low level or a high level to the ALS lines SL1 through SLn. In some embodiments, the ALS driver 400 may use gate signals or an internal intermediate signal from the gate driver 200 for generating the ALS voltage. The ALS voltage is applied after a charging operation of the pixel P is completely performed, i.e., when a gate signal applied to the gate line is changed from the gate on voltage to the gate off voltage.

The ALS driver 400 includes a plurality of ALS driving circuits ALS 1 through ALSn (not shown). The ALS driving circuits ALS 1 through ALSn include odd numbered ALS driving circuits that output ALS voltages S1, S3, S5, . . . to odd numbered ALS lines SL1, SL3, SL5, . . . , and even numbered ALS driving circuits that output ALS voltages S2, S4, S6, . . . to even numbered ALS lines SL2, SL4, SL6, . . . . The ALS voltages 51, S3, S5, . . . applied to the odd numbered ALS lines SL1, SL3, SL5, . . . and the ALS voltages S2, S4, S6, . . . applied to the even numbered ALS lines SL2, SL4, SL6, . . . have different levels. For example, if the ALS voltages S1, S3, S5, . . . applied to the odd numbered ALS lines SL1, SL3, SL5, . . . have voltages of a high level, the ALS voltages S2, S4, S6, . . . applied to the even numbered ALS lines SL2, SL4, SL6, . . . have voltages of a low level. Certain embodiments of structures and operations of the ALS circuits ALS1 through ALSn are described below.

The timing controller 500 receives input image data and an input control signal used to control displaying of the input image data from an external graphic controller (not shown). The input control signal includes, for example, a horizontal synchronization signal Hsync, a vertical synchronization signal Vsync, and a main clock MCLK. The timing controller 500 transfers the input image data to the data driver 300, generates a gate control signal CONT1, a data control signal CONT2, and an ALS control signal CONT3, and transfers the gate control signal CONT1, the data control signal CONT2, and the ALS control signal CONT3 to the gate driver 200, the data driver 300, and the ALS driver 400, respectively.

According to the control signals, the gate on voltage is sequentially applied to the gate lines GL1 through GLn, and accordingly data signals are applied to all pixels, in order for the liquid crystal panel 100 to display an image of a frame.

Figure 2A:
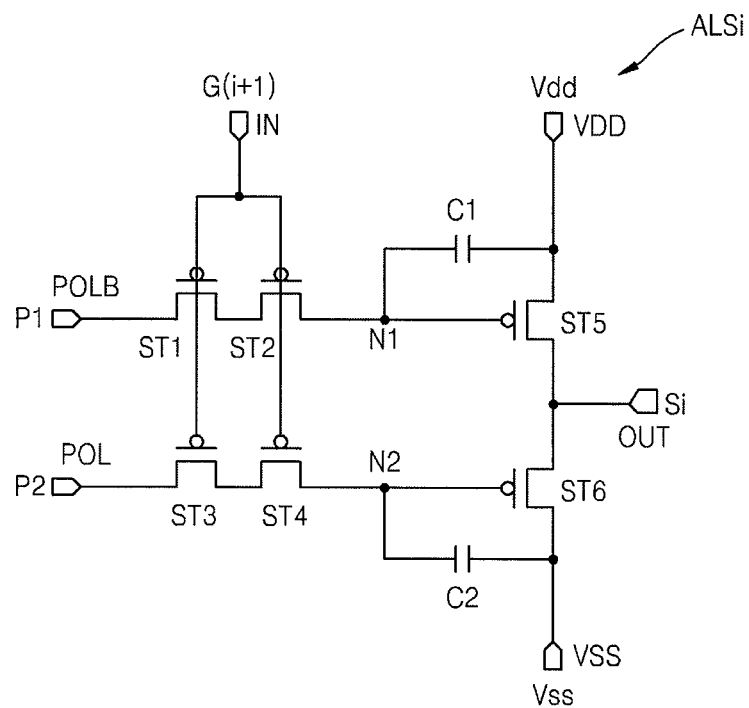
FIG. 2A is a circuit diagram of an odd numbered active level shift (ALS) driving circuit of an ALS driver.
Figure 2B:
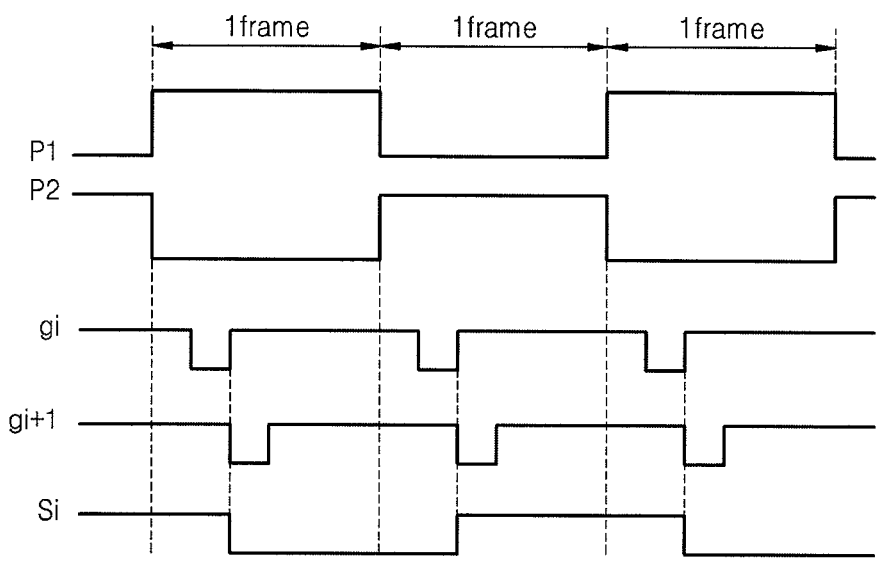
FIG. 2B is a timing diagram of an operation of the odd numbered ALS driving circuit of FIG. 2A according to an embodiment.
Figure 3A:
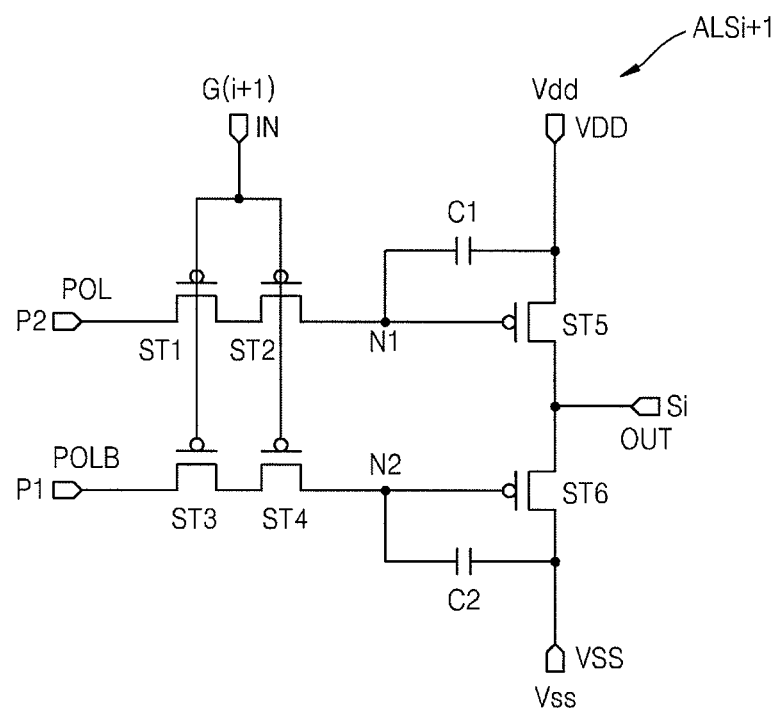
FIG. 3A is a circuit diagram of an even numbered ALS driving circuit of an ALS driver.
Figure 3B:
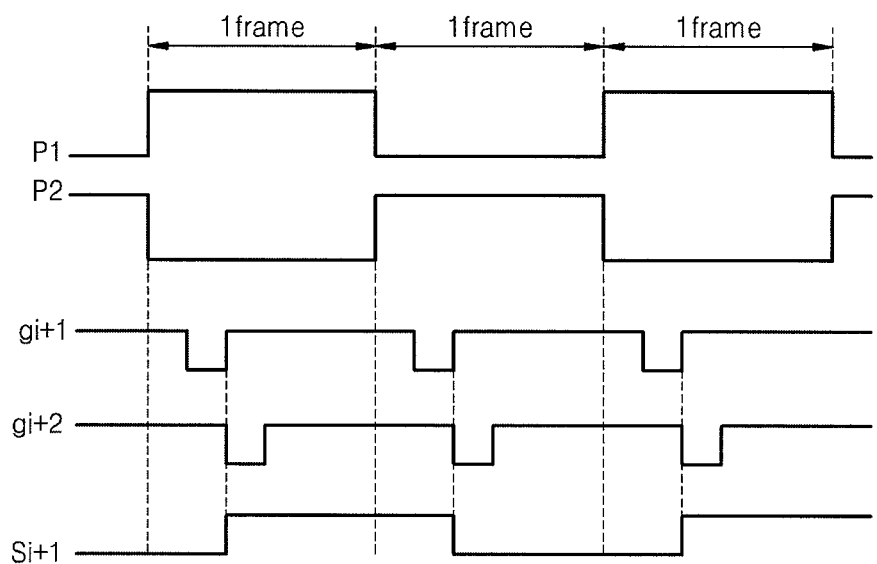
FIG. 3B is a timing diagram of an operation of the even numbered ALS driving circuit of FIG. 3A according to an embodiment.

FIGS. 2A and 3A are circuit diagrams of an $i^{th}$ odd numbered ALS driving circuit ALSi and an $i+1^{th}$ even numbered ALS driving circuit ALSi+1 of an embodiment of an ALS driver, and FIGS. 2B and 3B are timing diagrams of operations of the $i^{th}$ odd numbered ALS driving circuit ALSi and the $i+1^{th}$ even numbered ALS driving circuit ALSi+1 of FIGS. 2A and 3A, respectively. In this regard, i denotes an odd number.

Referring to FIG. 2A, the $i^{th}$ odd numbered ALS driving circuit ALSi includes first through sixth switching devices ST1 through ST6, a first capacitor C1, and a second capacitor C2. A first power voltage Vdd is a high level supplied from a first power source. A second power voltage Vss is a low level supplied from a second power source. A first polarity voltage P1 and a second polarity voltage P2 have opposite polarities and are respectively output through a first polarity terminal POLB and a second polarity terminal POL, and each of the first and second polarity voltages P1 and P2 alternates by frame between being at a high level voltage and being at a low level.

The first switching device ST1 includes a gate electrode electrically connected to an input terminal IN, a first electrode (a source electrode or a drain electrode) electrically connected to the first polarity terminal POLB, and a second electrode (a drain electrode or a source electrode) electrically connected to a first electrode of the second switching device ST2.

The second switching device ST2 includes a gate electrode electrically connected to the input terminal IN, the first electrode electrically connected to the second electrode of the first switching device ST1, and a second electrode electrically connected to a first node N1.

The third switching device ST3 includes a gate electrode electrically connected to the input terminal IN, a first electrode electrically connected to the second polarity terminal POL, and a second electrode electrically connected to a first electrode of the fourth switching device ST4.

The fourth switching device ST4 includes a gate electrode electrically connected to the input terminal IN, the first electrode electrically connected to the second electrode of the third switching device ST3, and a second electrode electrically connected to a second node N2.

The fifth switching device ST5 includes a gate electrode electrically connected to the first node N1, a first electrode electrically connected to a first power terminal VDD, and a second electrode electrically connected to a second electrode of the sixth switching device ST6 and an output terminal OUT.

The sixth switching device ST6 includes a gate electrode electrically connected to the second node N2, a first electrode electrically connected to a second power terminal VSS, and the second electrode electrically connected to the second electrode of the fifth switching device ST5 and the output terminal OUT.

The first capacitor C1 includes a first electrode electrically connected to the first node N1 and a second electrode electrically connected to the first power terminal VDD. The first capacitor C1 stores a voltage difference between the first node N1 and the first power terminal VDD.

The second capacitor C2 includes a first electrode electrically connected to the second node N2 and a second electrode electrically connected to the second power terminal VSS. The second capacitor C2 stores a voltage difference between the second node N2 and the second power terminal VSS.

Referring to FIG. 2B, the first polarity voltage P1 and the second polarity voltage P2 each alternate by frame between a high level voltage and a low level voltage and are respectively applied to the first polarity terminal POLB and the second polarity terminal POL. A next gate signal, i.e., an $i+1^{th}$ gate signal Gi+1, is applied to the input terminal IN When an $i^{th}$ gate signal Gi is turned off, and the $i+1^{th}$ gate signal Gi+1 is turned on, an $i^{th}$ ALS voltage Si is changed and output.

If the $i+1^{th}$ gate signal Gi+1 of a low level is applied to the input terminal IN, the first through fourth switching devices ST1 through ST4 are turned on, and the first polarity voltage P1 and the second polarity voltage P2 are transferred to the first node N1 and the second node N2, respectively. In this case, if the second polarity signal P2 has a low level, the sixth switching device ST6 is turned on, and the second power voltage Vss applied from the second power terminal VSS is output to the output terminal OUT through the sixth switching device ST6. Thus, the ALS voltage Si of a low level is applied to an ALS line. If the first polarity signal P1 has a low level, the fifth switching device ST5 is turned on, and the first power voltage Vdd applied from the first power terminal VDD is output to the output terminal OUT through the fifth switching device ST5. Thus, the ALS voltage Si of a high level is applied to the ALS line.

Referring to FIG. 3A, the $i+1^{th}$ even numbered ALS driving circuit ALSi+1 is different from the $i^{th}$ odd numbered ALS driving circuit ALSi of FIG. 2A in that the first electrode of the first switching device ST1 is electrically connected to the second polarity terminal POL, and the first electrode of the third switching device ST3 is electrically connected to the first polarity terminal POLB. A structure and an operation of the $i+1^{th}$ even numbered ALS driving circuit ALSi+1 are the same as those of the $i^{th}$ odd numbered ALS driving circuit ALSi of FIG. 2A. Thus, a specific description of the $i+1^{th}$ even numbered ALS driving circuit ALSi+1 will be omitted.

Referring to FIG. 3B, the first polarity voltage P1 and the second polarity voltage P2 each alternate by frame between a high level voltage and a low level voltage and are respectively applied to the first polarity terminal POLB and the second polarity terminal POL. A next gate signal, i.e., an $i+2^{th}$ gate signal Gi+2, is applied to the input terminal IN. When the $i+1^{th}$ gate signal Gi+1 is turned off, and the $i+2^{th}$ gate signal Gi+2 is turned on, an $i+1^{th}$ ALS voltage Si+1 is changed and output.

If the $i+2^{th}$ gate signal Gi+2 of a low level is applied to the input terminal IN, the first through fourth switching devices ST1 through ST4 are turned on, and the second polarity voltage P2 and the first polarity voltage P1 are transferred to the first node N1 and the second node N2, respectively. In this case, if the second polarity signal P2 has a low level, the fifth switching device ST5 is turned on, and the first power voltage Vdd applied from the first power terminal VDD is output to the output terminal OUT through the fifth switching device ST5. Thus, the ALS voltage Si+1 of a high level is applied to an ALS line. If the first polarity signal P1 has a low level, the sixth switching device ST6 is turned on, and the second power voltage Vss applied from the second power terminal VSS is output to the output terminal OUT through the sixth switching device ST6. Thus, the ALS voltage Si+1 of a low level is applied to the ALS line.

In the present embodiment, the ALS driver receives a gate signal G output to a gate line and the first polarity voltage P1 and the second polarity voltage P2. The ALS driver outputs the first power voltage Vdd and the second power voltage Vss. In some cases, a threshold voltage Vth of the first through fourth switching devices ST1 through ST4 drops. Since gate source voltages of the fifth switching device ST5 and the sixth switching device ST6 may then be 0 V, voltages may greatly drop in the first capacitor C1 and the second capacitor C2 due to leakage.

Figure 4:
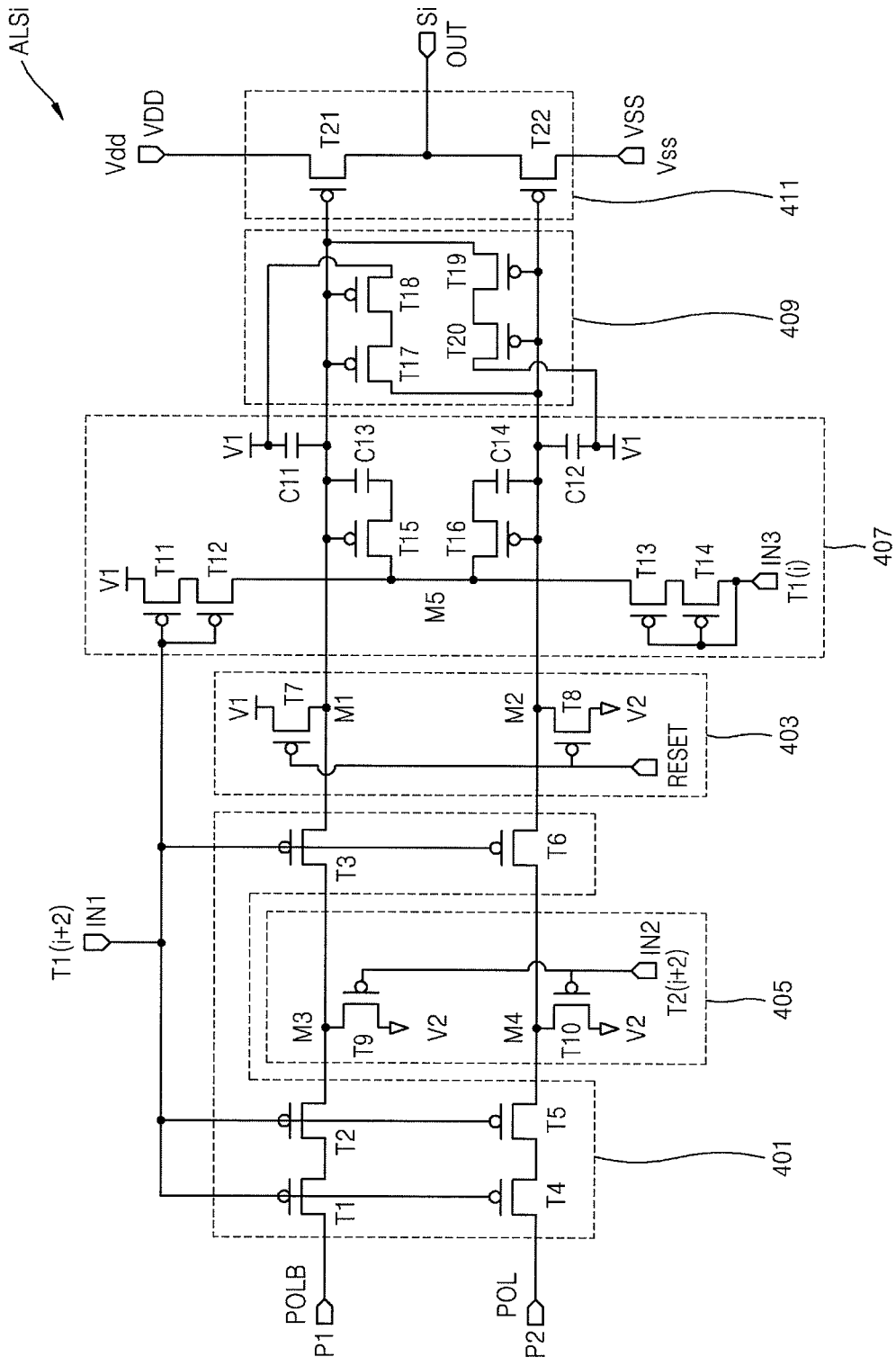
FIG. 4 is a circuit diagram of an odd numbered ALS driving circuit of an ALS driver according to another embodiment.

FIG. 4 is a circuit diagram of an $i^{th}$ odd numbered ALS driving circuit ALSi of an ALS driver according to another embodiment. Descriptions with respect to the $i^{th}$ odd numbered ALS driving circuit ALSi of the present embodiment applies to all odd numbered ALS driving circuits of the ALS driver. In this regard, i denotes an odd number.

Referring to FIG. 4, the $i^{th}$ odd numbered ALS driving circuit ALSi includes an input unit 401, a reset unit 403, a first level compensation unit 405, a boosting unit 407, a second level compensation unit 409, and an output unit 411. The switching devices of the present embodiment are PMOS transistors, and thus a low level voltage is an active voltage, and a high level voltage is a non-active voltage. Other switching devices, such as NMOS transistors, can alternatively be used.

The first polarity voltage P1 is supplied from the first polarity terminal POLB. The second polarity voltage P2 is supplied from the second polarity terminal POL. The first polarity voltage P1 and the second polarity voltage P2 have opposite polarities, have a signal cycle corresponding to a frame unit, and each alternates by frame between being a low level voltage and being a high level voltage.

The first power voltage Vdd is a high level signal supplied from the first power terminal VDD. The second power voltage Vss is a low level signal supplied from the second power terminal VSS. The first power voltage Vdd may be a common voltage Vcomh of a high level. The second power voltage Vss may be a common voltage Vcoml of a low level.

A third power voltage V1 is a high level signal supplied to a third power terminal. A fourth power voltage V2 is a low level signal supplied a fourth power terminal. The third power voltage V1 may be a high level voltage Vgh of a gate signal. The fourth power voltage. V2 may be a low level voltage Vgl of the gate signal.

Two internal signals T1 and T2 are not gate signals applied to a gate line but are intermediate signals output from an internal node of the gate driver. A voltage and timing relationship between the internal signals T1 and T2 is shown in FIG. 5.

Figure 5:
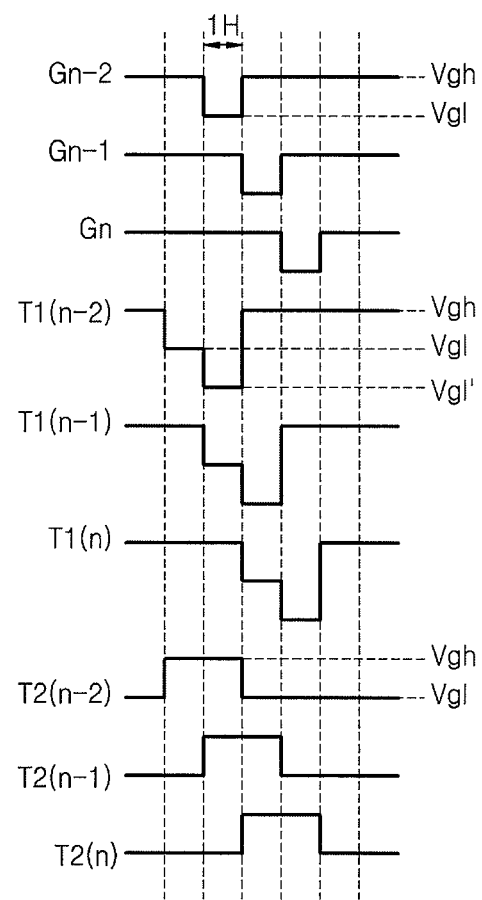
FIG. 5 is a timing diagram of a voltage relationship between internal signals of FIG. 4 according to an embodiment.

FIG. 5 is a timing diagram of a voltage relationship between internal signals of FIG. 4 according to an embodiment. Referring to FIG. 5, the internal signals T1 and T2 have opposite polarities. A low level voltage of the first internal signal T1 is either a first level voltage and a second level voltage that is lower than the first level voltage. The first level voltage may be the low level voltage Vg1 of the gate signal and the second level voltage may be a voltage Vg1' that is lower than the low level voltage Vg1 of the gate signal.

The internal signal T1 of a next gate stage is output as the first level voltage when a gate signal of a current gate stage is output as the low level voltage Vg1. Thereafter, the internal signal T1 of the next gate signal is output as the second level voltage when the gate signal of the current gate stage outputs the high level voltage Vgh and when the next gate stage outputs the low level voltage Vg1. In this regard, the internal signal T2 outputs the high level voltage Vgh when the internal signal T1 is output as the low level voltage.

For example, n-2$^{th}$, n-1$^{th}$, and n$^{th}$ gate signals Gn-2, Gn-1, and Gn are sequentially applied to n-2$^{th}$, n-1$^{th}$, and n$^{th}$ gate lines. In this regard, when the n-2$^{th}$ gate signal Gn-2 is output as the low level voltage Vg1, an n-1$^{th}$ first internal signal T1(n-1) is output as the first level voltage Vg1. Thereafter, the n-1$^{th}$ first internal signal T1(n-1) is output as the second level voltage Vg1' when the n-2$^{th}$ gate signal Gn-2 is output as the high level voltage Vgh and when the n-1$^{th}$ gate signal Gn-1 is output as the low level voltage Vg1. Thereafter, the n-1$^{th}$ first internal signal T1(n-1) is output as the high level voltage Vgh when the n$^{th}$ gate signal Gn is output as the low level voltage Vg1. In this regard, n-2$^{th}$, n-1$^{th}$, and n$^{th}$ second internal signals T2(n-2), T2(n-1), and T2(n) are output as a high level voltage during 2H periods when n-2$^{th}$, n-1$^{th}$, and n$^{th}$ second internal signals T1(n-2), T1(n-1), and T1(n) are output as the first level voltage and the second level voltage.

Referring to FIG. 4, the input unit 401 includes first through sixth transistors T1 through T6.

The first transistor T1 includes a gate electrode electrically connected to a first input terminal IN1, a first electrode (a source electrode or a drain electrode) electrically connected to the first polarity terminal POLB, and a second electrode (the drain electrode or the source electrode) electrically connected to a first electrode of the second transistor T2.

The second transistor T2 includes a gate electrode electrically connected to the first input terminal IN1, the first electrode electrically connected to the second electrode of the first transistor T1, and a second electrode electrically connected to a third node M3.

The third transistor T3 includes a gate electrode electrically connected to the first input terminal IN1, a first electrode electrically connected to the third node M3, and a second electrode electrically connected to the first node M1.

The first through third transistors T1, T2, and T3 are turned on if a first internal signal T1(i+2) of a low level is applied to the gate electrodes thereof and transfer the first polarity voltage P1 to the first node M1 when turned on.

The fourth transistor T4 includes a gate electrode electrically connected to the first input terminal IN1, a first electrode electrically connected to the second polarity terminal POL, and a second electrode electrically connected to a first electrode of the fifth transistor T5.

The fifth transistor T5 includes a gate electrode electrically connected to the first input terminal IN1, the first electrode electrically connected to the second electrode of the fourth transistor T4, and a second electrode electrically connected to a fourth node M4.

The sixth transistor T6 includes a gate electrode electrically connected to the first input terminal IN1, a first electrode electrically connected to the fourth node M4, and a second electrode electrically connected to a second node M2.

The fourth through sixth transistors T4, T5, and T6 are turned on if the first internal signal T1(i+2) of a low level is applied to the gate electrodes thereof and transfer the second polarity voltage P2 to the second node M2 when turned on.

The first internal signal T1(i+2) is output from a next odd numbered gate circuit, i.e. the i$^{th}$ odd numbered gate circuit. The first internal signal T1 including the first level voltage Vg1 and the second level voltage Vg1' lower than the first level voltage Vg1 is used instead of a gate signal including a single low level voltage, thereby preventing a Vth drop of the first through sixth transistors T1 through T6 of the input unit 401.

Meanwhile, if a low level voltage is applied to the first node M1 and the second node M2 according to the first and second polarity voltages P1 and P2, twenty-first and twenty-second transistors T21 and T22 are turned on. Therefore, a node to which a low level voltage is applied will be referred to as an on node, and a node to which a high level voltage is applied will be referred to as an off node below.

The reset unit 403 includes a seventh transistor T7 and an eighth transistor T8. The reset unit 403 applies voltages having opposite polarities to the floating first and second nodes M1 and M2 and sets an ALS voltage of the i$^{th}$ odd numbered ALS driving circuit ALSi to a low level. Thus, the ALS voltage is stably output from a low level to a high level during an initial operation of the ALS circuit.

The seventh transistor T7 includes a gate electrode electrically connected to a reset terminal RESET, a first electrode electrically connected to the third power terminal, and a second electrode electrically connected to the first node M1.

The eighth transistor T8 includes a gate electrode electrically connected to the reset terminal RESET, a first electrode electrically connected to the fourth power terminal, and a second electrode electrically connected to the second node M2.

If a reset signal R is applied to the reset terminal RESET, the seventh transistor T7 is turned on and transfers the third power voltage V1 of a high level from the third power terminal to the first node M1, and the eight transistor T8 is turned on and transfers the fourth power voltage V2 of a low level from the fourth power terminal to the second node M2. Thus, the twenty-second transistor T22 of the output unit 411 is turned on and outputs the second power voltage Vss from the second power terminal VSS an output node OUT. Therefore, the output signal of the i$^{th}$ odd numbered ALS driving circuit ALSi is maintained at a low level.

The first level compensation unit 405 includes a ninth transistor T9 and a tenth transistor T10. The first level compensation unit 405 applies a low level voltage to the third node M3 and the fourth node M4, and compensates for a voltage drop due to leakage for whichever of the first node M1 and the second node M2 is an on node in a frame.

The ninth transistor T9 includes a gate electrode electrically connected to a second input terminal IN2, a first electrode electrically connected to the fourth power terminal, and a second electrode electrically connected to the third node M3.

The tenth transistor T10 includes a gate electrode electrically connected to the second input terminal IN2, a first electrode electrically connected to the fourth power terminal, and a second electrode electrically connected to the fourth node M4.

A second internal signal T2(i+2) is applied to the second input terminal IN2 and is output from the next odd numbered gate circuit. The second internal signal T2(i+2) is output at a low level when the first internal signal T1(i+2) is output at a high level. If the second internal signal T2(i+2) of a low level is applied, the ninth transistor T9 and the tenth transistor T10 are turned on and the fourth power voltage V2 of a low level is applied to the third node M3 and the fourth node M4. Thus, if the first node M1 is an on node, a current leakage Ioff is reduced when the third transistor T3 is turned off by reducing Vds of the third transistor T3. If the second node M2 is an on node, a current leakage Ioff is reduced when the sixth transistor T6 is turned off by reducing Vds of the sixth transistor T6.

The boosting unit 407 includes eleventh through sixteenth transistors T11 through T16 and first through fourth capacitors C11 through C14. The boosting unit 407 increases an operating current of the output unit 411 by increasing a potential of whichever of the first node M1 and the second node M2 is an on node. The potential of on node becomes lower in a PMOS circuit and higher in an NMOS circuit.

The eleventh transistor T11 includes a gate electrode electrically connected to the first input terminal IN1, a first electrode electrically connected to the third power terminal, and a second electrode electrically connected to a first electrode of the twelfth transistor T12. The twelfth transistor T12 includes a gate electrode electrically connected to the first input terminal IN1, the first electrode electrically connected to the second electrode of the eleventh transistor T11, and a second electrode electrically connected to a fifth node M5.

The thirteenth transistor T13 includes a gate electrode electrically connected to a third input terminal IN3, a first electrode electrically connected to a second electrode of the fourteenth transistor T14, and a second electrode electrically connected to the fifth node M5. The fourteenth transistor T14 includes a gate electrode and a first electrode electrically connected to the third input terminal IN3, and the second electrode electrically connected to the first electrode of the thirteenth transistor T13.

The fifteenth transistor T15 includes a gate electrode electrically connected to the first node M1, a first electrode electrically connected to the fifth node M5, and a second electrode electrically connected to a first electrode of the third capacitor C13. The sixteenth transistor T16 includes a gate electrode electrically connected to the second node M2, a first electrode electrically connected to the fifth node M5, and a second electrode electrically connected to a first electrode of the fourth capacitor C14.

The first capacitor C11 includes a first electrode electrically connected to the third power terminal and a second electrode electrically connected to the first node M1. The second capacitor C12 includes a first electrode electrically connected to the third power terminal and a second electrode electrically connected to the second node M2. The third capacitor C13 includes the first electrode electrically connected to the second electrode of the fifteenth transistor T15 and a second electrode electrically connected to the first node M1. The fourth capacitor C14 includes the first electrode electrically connected to the second electrode of the sixteenth transistor T16 and a second electrode electrically connected to the second node M2.

A third internal signal T1($i$) is applied to the third input terminal IN3, and is output from the $i^{th}$ odd numbered gate circuit. The third internal signal T1($i$) is applied 2H earlier than the first internal signal T1($i$+2). The third internal signal T1($i$) of a low level, i.e., the first voltage level Vg1 and the second voltage level Vg1', is applied to the third input terminal IN3.

If the first internal signal T1($i$+2) of a low level is applied to the first input terminal IN1, the eleventh transistor T11 and the twelfth transistor T12 are turned on, and the third power voltage V1 of a high level is applied to the fifth node M5.

Subsequently, if the first internal signal T1($i$+2) of a high level is applied to the first input terminal IN1 and the third internal signal T1($i$) of a low level is applied to the third input terminal IN3, the thirteenth transistor T13 and the fourteenth transistor T14 are turned on, and the third internal signal T1($i$) of a low level is applied to the fifth node M5. Thus, the fifth node M5 is switched from a high level to a low level.

If the first node M1 maintains a low level voltage, i.e., if the first node M1 is an on node, the fifteenth transistor T15 is turned on and transfers the low level voltage of the fifth node M5 to the first electrode of the third capacitor C13. Thus, a voltage of the first node M1 is further lowered according to a capacitance ratio of the first capacitor C11 and the third capacitor C13, which increases a driving current Ion and Vgs of the twenty-first transistor T21. If the second node M2 maintains a low level voltage, i.e., if the second node M2 is an on node, the sixteenth transistor T16 is turned on and transfers the low level voltage of the fifth node M5 to the first electrode of the fourth capacitor C14. Thus, a voltage of the second node M2 is further lowered according to a capacitance ratio of the second capacitor C12 and the fourth capacitor C14, which increases the driving current Ion and Vgs of the twenty-second transistor T22.

The second level compensation unit 409 includes seventeenth through twentieth transistors T17 through T20, and maintains whichever of the first node M1 and the second node M2 is an off node at a high voltage level without a drop in voltage.

The seventeenth transistor T17 includes a gate electrode electrically connected to the first node M1, a first electrode electrically connected to a second electrode of the eighteenth transistor T18, and a second electrode electrically connected to the second node M2. The eighteenth transistor T18 includes a gate electrode electrically connected to the first node M1, a first electrode electrically connected to the third power terminal, and the second electrode electrically connected to the first electrode of the seventeenth transistor T17.

The nineteenth transistor T19 includes a gate electrode electrically connected to the second node M2, a first electrode electrically connected to a second electrode of the twentieth transistor T20, and a second electrode electrically connected to the first node M1. The twentieth transistor T20 includes a gate electrode electrically connected to the second node M2, a first node electrically connected to the third power terminal, and the second electrode electrically connected to the first electrode of the nineteenth transistor T19.

If the first node M1 is an on node, and the second node M2 is an off node, the seventeenth transistor T17 and the eighteenth transistor T18 are turned on, and the third power voltage V1 of a high level is transferred to the second node M2, which reduces a drop in voltage of the second node M2 of a high level. If the second node M2 is an on node, and the first node M1 is an off node, the nineteenth transistor T19 and the twentieth transistor T20 are turned on, and the third power voltage V1 of a high level is transferred to the first node M1, which reduces a drop in voltage of the first node M1 of a high level.

The output unit 411 includes the twenty-first and twenty-second transistors T21 and T22, and outputs the first power voltage Vdd or the second power voltage Vss to the output node OUT. The twenty-first transistor T21 includes a gate electrode electrically connected to the first node M1, a first electrode electrically connected to the first power terminal VDD, and a second electrode electrically connected to the output terminal OUT and a second electrode of the twenty-second transistor T22. The twenty-second transistor T22 includes a gate electrode electrically connected to the second node M2, a first electrode electrically connected to the second power terminal VSS, and the second electrode electrically connected to the output terminal OUT and the second electrode of the twenty-first transistor T21.

If the first node M1 is an on node, and the second node M2 is an off node, the twenty-first transistor T21 is turned on, and the first power voltage Vdd is output as the ALS voltage Si. If the second node M2 is an on node, and the first node M1 is an off node, the twenty-second transistor T22 is turned on, and the second power voltage Vss is output as the ALS voltage Si.

Figure 6:
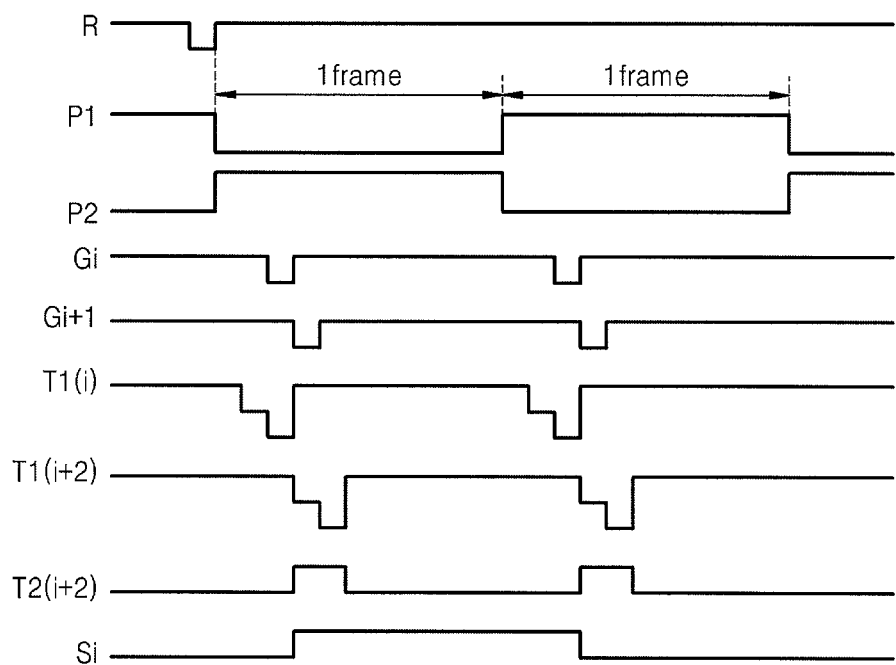
FIG. 6 is a timing diagram of an operation of the odd numbered ALS driving circuit of FIG. 4 according to an embodiment.

FIG. 6 is a timing diagram of an operation of the $i^{th}$ odd numbered ALS driving circuit ALSi of FIG. 4 according to an embodiment. Referring to FIG. 6, a case where the first polarity voltage P1 of a low level and where the second polarity voltage P2 of a high level are applied in a first frame is described below.

Before operation begins, the first through fourth nodes M1 through M4 are floating. The reset unit 403 is used to apply an initial voltage to the first node M1 and the second node M2 and to determine an initial ALS voltage Si.

If the reset signal R is applied to the gates electrodes of the seventh transistor T7 and the eighth transistor T8, the seventh transistor T7 and the eighth transistor T8 are turned on. Thus, the third power voltage V1 of a high level is applied to the first node M1, and the fourth power voltage V2 of a low level is applied to the second node M2. The second node M2 is an on node, the twenty-second transistor T22 of the output unit 411 is turned on and outputs the second power voltage Vss as the initial ALS voltage Si. Thereafter, the $i^{th}$ odd numbered ALS driving circuit ALSi alternately outputs the ALS voltage Si of a high level and the ALS voltage Si of a low level.

If the $i^{th}$ gate signal Gi has a gate off voltage, and the $i+1^{th}$ gate signal Gi+1 has a gate on voltage, the first internal signal T1($i$+2) of a low level is applied to the first input terminal IN1. The first through sixth transistors T1 through T6 are turned on, and the first polarity voltage P1 and the second polarity voltage P2 are respectively applied to the first node M1 and the second node M2. Therefore, the first node M1 is an on node, and the second node M2 is an off node. Thus, the twenty-first transistor T21 is turned on, and the first power voltage Vdd of a high level is output as the ALS voltage Si during the first frame from the first power terminal VDD to the output terminal OUT.

Further, the eleventh transistor T11 and the twelfth transistor T12 are turned on, and the third power voltage V1 of a high level is applied to the fifth node M5. The fifteenth transistor T15 including the gate electrode connected to the first node M1, which is an on node, is turned on, and applies the third power voltage V1 of a high level to the first electrode of the third capacitor C13. A voltage difference between the third power voltage V1 and the first polarity voltage P1 is stored in the first capacitor C11 and the third capacitor C13.

The seventeenth transistor T17 and the eighteenth transistor T18 including the gate electrodes connected to the first node M1, which is an on node, are turned on, and apply the third power voltage V1 of a high level to the second node M2. Thus, a drop in voltage of the second node M2, which is an off node, is compensated.

If the first internal signal T1($i$+2) is switched to a high level, and the second internal signal T2($i$+2) of a low level is applied to the second input terminal IN2, the first through sixth transistors T1 through T6 are turned off, and the nineteenth transistor T9 and the tenth transistor T10 are turned on. Thus, the fourth power voltage V2 of a low level is applied to the third node M3 and the fourth node M4, which reduces Vds and the leakage current Ioff of the third transistor T3, which is turned off.

If the third level signal T1($i$) having first and second low levels is applied to the third input terminal IN3, the thirteenth transistor T13 and the fourteenth transistor T14 are turned on, and the third internal signal T1($i$) is applied to the fifth node M5. The fifth node M5 is switched from a high voltage level to a low voltage level. The low level voltage is applied to the first electrode of the third capacitor C13 through the fifteenth transistor T15. Thus, a voltage of the first node M1 is further reduced by the third capacitor C13, which is a boosting capacitor, which increases Vgs and the driving current Ion of the twenty-first transistor T21.

Next, a case where the first polarity voltage P1 of a high level and the second polarity voltage P2 of a low level are applied during a second frame is described below.

If the $i^{th}$ gate signal Gi has a gate off voltage, and the $i+1^{th}$ gate signal Gi+1 has a gate on voltage, the first internal signal T1($i$+2) of a low level is applied to the first input terminal IN1. The first through sixth transistors T1 through T6 are turned on, and the first polarity voltage P1 and the second polarity voltage P2 are respectively applied to the first node M1 and the second node M2. Therefore, the first node M1 is an off node, and the second node M2 is an on node. Thus, the twenty-second transistor T22 is turned on, and the second power voltage Vss of a low level is output as the ALS voltage Si during the second frame.

Further, the eleventh transistor T11 and the twelfth transistor T12 are turned on, and the third power voltage V1 of a high level is applied to the fifth node M5. The sixteenth transistor T16 including the gate electrode connected to the second node M2, which is an on node, is turned on, and applies the third power voltage V1 of a high level to the first electrode of the fourth capacitor C14. A voltage difference between the third power voltage V1 and the second polarity voltage P2 is stored in the second capacitor C12 and the fourth capacitor C14.

The nineteenth transistor T19 and the twentieth transistor T20 including the gate electrodes connected to the second node M2, which is an on node, are turned on, and applies the third power voltage V1 of a high level to the first node M1. Thus, a drop in voltage of the first node M1, which is an off node, is compensated.

If the first internal signal T1($i$+2) is switched to a high level, and the second internal signal T2($i$+2) of a low level is applied to the second input terminal IN2, the first through sixth transistors T1 through T6 are turned off, and the nineteenth transistor T9 and the tenth transistor T10 are turned on. Thus, the fourth power voltage V2 of a low level is applied to the third node M3 and the fourth node M4, which reduces Vds and the leakage current Ioff of the sixth transistor T6, which is turned off.

If the third level signal T1($i$) having first and second low levels is applied to the third input terminal IN3, the thirteenth transistor T13 and the fourteenth transistor T14 are turned on, and the third internal signal T1($i$) is applied to the fifth node M5. The fifth node M5 is switched from a high voltage level to a low voltage level. The low level voltage is applied to the first electrode of the fourth capacitor C14 through the sixteenth transistor T16. Thus, a voltage of the second node M2 is further reduced by the fourth capacitor C14, which is a boosting capacitor, which increases Vgs and the driving current Ion of the twenty-second transistor T22.

Figure 7:
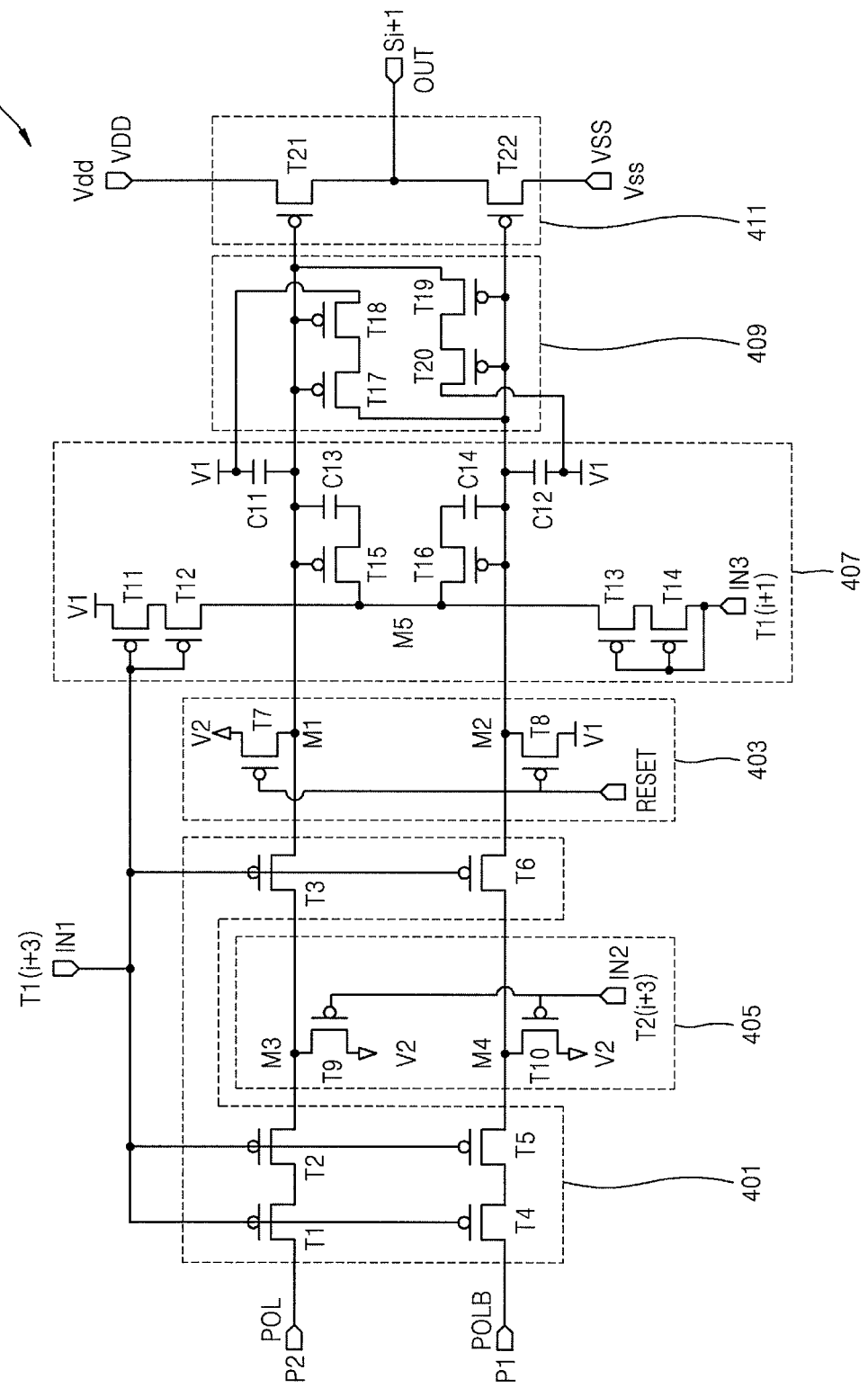
FIG. 7 is a circuit diagram of an even numbered ALS driving circuit of an ALS driver according to another embodiment.
Figure 8:
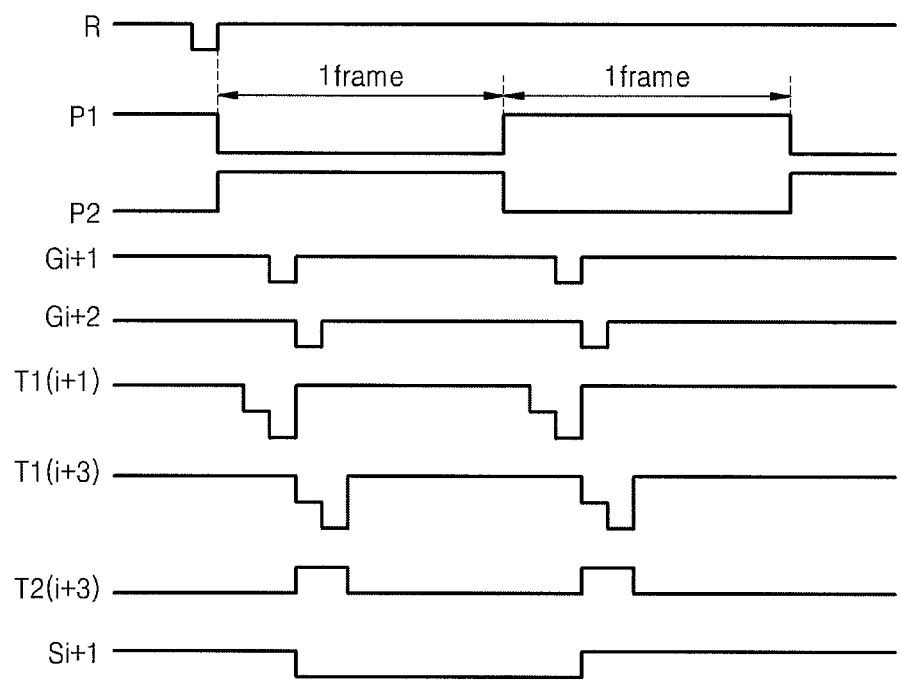
FIG. 8 is a timing diagram of an operation of the even numbered ALS driving circuit of FIG. 7 according to an embodiment.

FIG. 7 is a circuit diagram of an $i+1^{th}$ even numbered ALS driving circuit ALSi+1 of an ALS driver according to another embodiment. FIG. 8 is a timing diagram of an operation of the $i+1^{th}$ even numbered ALS driving circuit ALSi+1 of FIG. 7 according to an embodiment. Descriptions with respect to the $i+1^{th}$ even numbered ALS driving circuit ALSi+1 and an operation timing of FIGS. 7 and 8 apply to all even numbered ALS driving circuits of the ALS driver. In this regard, i denotes an odd number.

Referring to FIG. 7, the i+1$^{th}$ even numbered ALS driving circuit ALSi+1 includes the input unit 401, the reset unit 403, the first level compensation unit 405, the boosting unit 407, the second level compensation unit 409, and the output unit 411.

The first polarity terminal POLB, the second polarity terminal POL, the first power terminal VDD, the second power terminal VSS, the third power terminal, and the fourth power terminal provide the first polarity voltage P1, the second polarity voltage P2, the first power voltage Vdd, the second power voltage Vss, the third power voltage V1, and the fourth power voltage V2, respectively. The relationships between the input signals input by the input terminals are described with reference to FIG. 5 above.

The i+1$^{th}$ even numbered ALS driving circuit ALSi+1 is the same as the i$^{th}$ odd numbered ALS driving circuit ALSi of FIG. 4, except that the first electrode of the first transistor T1 is electrically connected to the second polarity terminal POL, and the first electrode of the fourth transistor T4 is electrically connected to the first polarity terminal POLB, the first electrode of the seventh transistor T7 is electrically connected to the fourth power terminal, and the first electrode of the eighth transistor T8 is electrically connected to the third power terminal. Thus, a detailed description of the elements of the i+1$^{th}$ even numbered ALS driving circuit ALSi+1 that are the same as those of the i$^{th}$ odd numbered ALS driving circuit ALSi of FIG. 4 is omitted.

Referring to FIG. 8, a case where the first polarity voltage P1 of a low level and the second polarity voltage P2 of a high level are applied in a first frame is described below.

Before operation, the first through fourth nodes M1 through M4 are floating. The reset unit 403 is used to apply an initial voltage to the first node M1 and the second node M2 and determine the initial ALS voltage Si+1.

If the reset signal R is applied to the gates electrodes of the seventh transistor T7 and the eighth transistor T8, the seventh transistor T7 and the eighth transistor T8 are turned on. Thus, the fourth power voltage V2 of a low level is applied to the first node M1, and the third power voltage V1 of a high level is applied to the second node M2. The first node M1 is an on node, the twenty-first transistor T21 is turned on and outputs the first power voltage Vdd as the initial ALS voltage Si+1. Thereafter, the i+1$^{th}$ even numbered ALS driving circuit ALSi+1 alternately outputs the ALS voltage Si+1 of a low level and the ALS voltage Si+1 of a high level.

If the i+1$^{th}$ gate signal Gi+1 has a gate off voltage, and the i+2$^{th}$ gate signal Gi+2 has a gate on voltage, a first internal signal T1($i$+3) of a low level is applied to the first input terminal IN1.

The first through sixth transistors T1 through T6 are turned on, and the second polarity voltage P2 and the first polarity voltage P1 are respectively applied to the first node M1 and the second node M2. Therefore, the first node M1 is an off node, and the second node M2 is an on node. Thus, the twenty-second transistor T22 is turned on, and the second power voltage Vss of a low level is output as the ALS voltage Si+1 during the first frame from the second power terminal VSS to the output terminal OUT.

Further, the eleventh transistor T11 and the twelfth transistor T12 are turned on, and the third power voltage V1 of a high level is applied to the fifth node M5. The sixteenth transistor T16 including the gate electrode connected to the second node M2, which is an on node, is turned on, and applies the third power voltage V1 of a high level to the first electrode of the fourth capacitor C14. A voltage difference between the third power voltage V1 and the first polarity voltage P1 is stored in the second capacitor C12 and the fourth capacitor C14.

The nineteenth transistor T19 and the twentieth transistor T20 including the gate electrodes connected to the second node M2, which is an on node, are turned on, and applies the third power voltage V1 of a high level to the first node M1. Thus, a drop in voltage of the first node M1, which is an off node, is compensated.

If the first internal signal T1($i$+3) of a high level is applied to the first input terminal IN1, and the second internal signal T2($i$+3) of a low level is applied to the second input terminal IN2 from an i+3$^{th}$ gate circuit, the first through sixth transistors T1 through T6 are turned off, and the nineteenth transistor T9 and the tenth transistor T10 are turned on. Thus, the fourth power voltage V2 of a low level is applied to the third node M3 and the fourth node M4, which reduces Vds and the leakage current Ioff of the sixth transistor T6, which is turned off.

If the third level signal T1($i$+1) having first and second low levels is applied from the i+1$^{th}$ gate circuit to the third input terminal IN3, the thirteenth transistor T13 and the fourteenth transistor T14 are turned on, and the third internal signal T1($i$+1) is applied to the fifth node M5. The fifth node M5 is switched from a high voltage level to a low voltage level. The low level voltage is applied to the first electrode of the fourth capacitor C14 through the sixteenth transistor T16. Thus, a voltage of the second node M2 is further reduced by the fourth capacitor C14, which is a boosting capacitor, which increases Vgs and the driving current Ion of the twenty-second transistor T22.

Next, a case where the first polarity voltage P1 of a high level and the second polarity voltage P2 of a low level are applied in a second frame is described below.

If the i+1$^{th}$ gate signal Gi+1 has a gate off voltage, and the i+2$^{th}$ gate signal Gi+2 has a gate on voltage, the first internal signal T1($i$+3) of a low level is applied to the first input terminal IN1. The first through sixth transistors T1 through T6 are turned on, and the second polarity voltage P2 and the first polarity voltage P1 are applied to the first node M1 and the second node M2. Therefore, the first node M1 is an on node, and the second node M2 is an off node. Thus, the twenty-first transistor T21 is turned on, and the first power voltage Vdd of a high level is output as the ALS voltage Si+1 during the second frame.

Further, the eleventh transistor T11 and the twelfth transistor T12 are turned on, and the third power voltage V1 of a high level is applied to the fifth node M5. The fifteenth transistor T15 including the gate electrode connected to the first node M1, which is an on node, is turned on, and applies the third power voltage V1 of a high level to the first electrode of the third capacitor C13. A voltage difference between the third power voltage V1 and the second polarity voltage P2 is charged in the first capacitor C11 and the third capacitor C13.

The seventeenth transistor T17 and the eighteenth transistor T18 including the gate electrodes connected to the first node M1, which is an on node, are turned on, and applies the third power voltage V1 of a high level to the second node M2. Thus, a drop of voltage of the second node M2, which is an off node, is compensated.

If the first internal signal T1($i$+3) of a high level is applied from the i+3$^{th}$ gate circuit to the first input terminal IN1, and the second internal signal T2($i$+3) of a low level is applied to the second input terminal IN2, the first through sixth transistors T1 through T6 are turned off, and the nineteenth transistor T9 and the tenth transistor T10 are turned on. Thus, the fourth power voltage V2 of a low level is applied to the third node M3 and the fourth node M4, which reduces Vds and the leakage current Ioff of the third transistor T3, which is turned off.

If the third internal signal T1(i+1) having first and second low levels is applied to the third input terminal IN3, the thirteenth transistor T13 and the fourteenth transistor T14 are turned on, and the third internal signal T1(i+1) is applied to the fifth node M5. The fifth node M5 is switched from a high voltage level to a low voltage level. The low level voltage is applied to the first electrode of the third capacitor C13 through the fifteenth transistor T15. Thus, a voltage of the first node M1 is further reduced by the third capacitor C13, which is a boosting capacitor, which increases Vgs and the driving current Ion of the twenty-first transistor T21.

Figure 9:
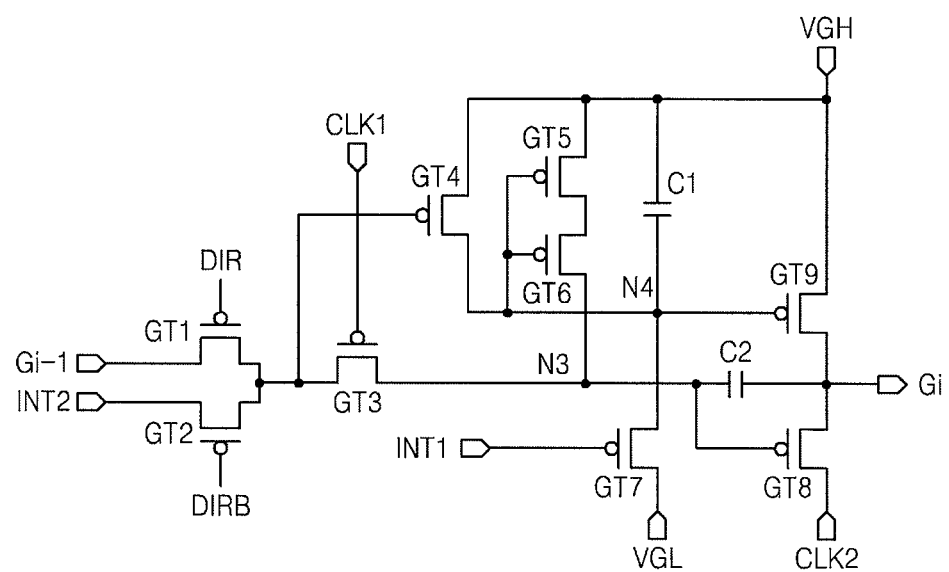
FIG. 9 is a circuit diagram of one of a plurality of stages included in a gate driver according to an embodiment.
Figure 10:
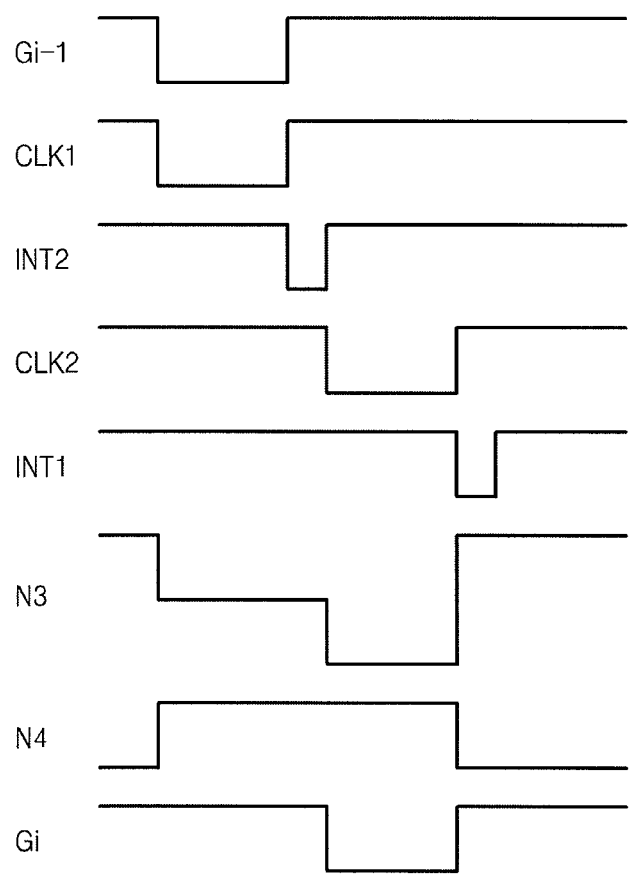
FIG. 10 is a timing diagram of an operation of a stage of FIG. 9 according to an embodiment.

FIG. 9 is a circuit diagram of one of a plurality of stages included in a gate driver according to an embodiment of the present invention. FIG. 10 is a timing diagram of an operation of a stage of FIG. 9 according to an embodiment of the present invention.

Referring to FIG. 9, the gate driver includes first through ninth switching devices GT1 through GT9, and first and second capacitors C1 and C2. A first voltage VGH (high level voltage VGH) is a high level signal supplied from an external power source. A second voltage VGL (low level voltage VGL) is a low level signal supplied from a second external power source. An operation of an $i^{th}$ stage of FIG. 9 will now be described with reference to FIG. 10.

If a first polarity voltage DIR of a low level is applied to a gate electrode of the first switching device GT 1, the first switching device GT 1 is turned on. If an i–$1^{th}$ gate signal Gi-1 and a first clock signal CLK1 of a low level are simultaneously applied to a gate electrode of the third switching device GT3, and the third switching device GT3 is turned on according to the first clock signal CLK1, the i–$1^{th}$ gate signal Gi-1 of a low level is applied to a node N3 through the first switching device GT1 and the third switching device GT3.

If the low level signal applied through the first switching device GT1 is applied to a gate electrode of the fourth switching device GT4, the fourth switching device GT4 is turned on, and the first voltage VGH of the high level is applied to a node N4 through the fourth switching device GT4. If a low level signal of the node N3 is applied to a gate electrode of the eighth switching device GT8, the eighth switching device GT8 is turned on, and a second clock signal CLK2 of a high level is output as the $i^{th}$ gate signal Gi through the eighth switching device GT8.

Thereafter, if a second polarity voltage DIRB of a low level is applied to a gate electrode of the second switching device GT2, the second switching device GT2 is turned on. If a second initialization signal INI2 of a low level applied through the second switching device GT2 is applied to a gate electrode of the fourth switching device GT4, the fourth switching device GT4 is turned on, and the first voltage VGH of the high level is applied to the node N4 through the fourth switching device GT4. The first clock signal CLK1 of the low level is changed to the first clock signal CLK1 of a high level during the application of the second polarity voltage DIRB of the low level, and thus the node N3 maintains the low level signal, and accordingly, an output terminal continuously outputs the $i^{th}$ gate signal Gi of a high level.

Next, if the second clock signal CLK2 of a low level is applied through the eighth switching device GT8, a signal level of the node N3 is further reduced according to the second clock signal CLK2, and the second clock signal CLK2 of the low level is output as the $i^{th}$ gate signal Gi through the eighth switching device GT8. Then, if a first initialization signal INI1 of a low level is applied to a gate electrode of the seventh switching device GT7, the second voltage VGL of the low level is applied to the node N4 through the seventh switching device GT7. A voltage of the node N4 of the low level is applied to gate electrodes of the fifth switching device GT5 and the sixth switching device GT6, and thus the first voltage VGH of the high level is applied to the node N3 through the fifth switching device GT5 and the sixth switching device GT6. Accordingly, the eighth switching device GT8 is turned off. Meanwhile, the voltage of the node N4 of the low level is applied to a gate electrode of the ninth switching device GT9, and thus the first voltage VGH of the high level is output as the $i^{th}$ gate signal Gi of a high level through the ninth switching device GT9.

Voltage signals formed in the nodes N3 and N4 during the generation of the $i^{th}$ gate signal Gi may be used as the internal signals T1 and T2, respectively, of an ALS driving circuit.

In the described embodiments, a voltage signal that is higher than an output signal of a gate driver is used to compensate for a Vth drop of a switching device, and an internal signal of the gate driver may be used as the high voltage signal, which does not need a separate voltage source. Further, an output voltage is stabilized during initial driving by initializing an ALS circuit, a drop in voltage of an on node or an off node of the ALS circuit is compensated, and a capacitor voltage is stabilized.

Although all switching devices (transistors) are realized as PMOS transistors in the described embodiments, a driving method of alternative embodiments can use other switching devices, such as NMOS transistors and inverted signals.

While various aspects and features have been shown and described with reference to exemplary embodiments, it will be understood by those of ordinary skill in the art that various changes in form and details may be made therein without departing from the spirit and scope of the present invention.

What is claimed is:

1. An active level shift (ALS) driver comprising a plurality of ALS driving circuits, wherein each of the plurality of ALS driving circuits comprises:
    an input unit configured to apply a first polarity voltage to a first node, and to apply a second polarity voltage to a second node;
    a reset unit configured to apply an initial voltage to the first node and the second node, wherein the reset unit is configured to receive a reset signal;
    a level compensation unit configured to compensate a voltage drop of the first node and the second node; and
    an output unit configured to output a first power voltage or a second power voltage according to the initial voltage and then to alternately output the first power voltage and the second power voltage according to the first polarity voltage and the second polarity voltage,
    wherein the ALS driver comprises only N-channel transistors or only P-channel transistors, and
    wherein the input unit comprises:
    a first transistor comprising a gate electrode electrically connected to a first input terminal to which a first input signal is applied, and a first electrode electrically connected to a first polarity terminal to which the first polarity voltage is applied;
    a second transistor comprising a gate electrode electrically connected to the first input terminal, a first electrode electrically connected to a second electrode of the first transistor, and a second electrode electrically connected to a third node;
    a third transistor comprising a gate electrode electrically connected to the first input terminal, a first electrode electrically connected to the third node, and a second electrode electrically connected to the first node;

a fourth transistor comprising a gate electrode electrically connected to the first input terminal, and a first electrode electrically connected to a second polarity terminal to which the second polarity voltage is applied;

a fifth transistor comprising a gate electrode electrically connected to the first input terminal, a first electrode electrically connected to a second electrode of the fourth transistor, and a second electrode electrically connected to a fourth node; and a sixth transistor comprising a gate electrode electrically connected to the first input terminal, a first electrode electrically connected to the fourth node, and a second electrode electrically connected to the second node, wherein the first polarity voltage and the second polarity voltage have opposite polarities.

2. The ALS driver of claim 1, wherein the level compensation unit comprises:

a first level compensation unit configured to compensate the voltage of one of the first and second nodes; and a second level compensation unit configured to compensate the voltage of one of the first and second nodes.

3. The ALS driver of claim 2, wherein the first level compensation unit comprises:

a ninth transistor comprising a gate electrode electrically connected to a second input terminal, a first electrode electrically connected to a fourth power terminal, and a second electrode electrically connected to a third node; and a tenth transistor comprising a gate electrode electrically connected to the second input terminal, a first electrode electrically connected to the fourth power terminal, and a second electrode electrically connected to a fourth node.

4. The ALS driver of claim 3, wherein a second input signal applied to the second input terminal has a polarity opposite to that of a first input signal.

5. The ALS driver of claim 2, wherein the second level compensation unit comprises:

an eighteenth transistor comprising a gate electrode electrically connected to the first node, and a first electrode electrically connected to a third power terminal;

a seventeenth transistor comprising a gate electrode electrically connected to the first node, a first electrode electrically connected to a second electrode of the eighteenth transistor, and a second electrode electrically connected to the second node;

a twentieth transistor comprising a gate electrode electrically connected to the second node, and a first electrode electrically connected to the third power terminal; and a nineteenth transistor comprising a gate electrode electrically connected to the second node, a first electrode electrically connected to a second electrode of the twentieth transistor, and a second electrode electrically connected to the first node.

6. The ALS driver of claim 1, wherein the first polarity voltage and the second polarity voltage are applied during an interval corresponding to a frame.

7. The ALS driver of claim 1, wherein the reset unit in odd numbered ALS driving circuits of the plurality of ALS driving circuits applies a third power voltage to the first node and a fourth power voltage to the second node so as to output the second power voltage, and the reset unit in even numbered ALS driving circuits of the plurality of ALS driving circuits applies the fourth power voltage to the first node and the third power voltage to the second node so as to output the first power voltage.

8. The ALS driver of claim 1, wherein each of the plurality of ALS driving circuits further comprises a boosting unit for increasing a potential of the first node or the second node, in response to a third input signal having a second level voltage being lower than a low voltage of a gate signal output from the gate driver, and increasing a driving current of the output unit.

9. The ALS driver of claim 1, wherein the first input signal has voltage levels of a first level voltage being the low voltage of the gate signal and of a second level voltage.

10. The ALS driver of claim 1, wherein the reset unit comprises:

a seventh transistor comprising a gate electrode electrically connected to a reset terminal, a first electrode electrically connected to a fourth power terminal, and a second electrode electrically connected to the first node; and an eighth transistor comprising a gate electrode electrically connected to the reset terminal, a first electrode electrically connected to a third power terminal, and a second electrode electrically connected to the second node.

11. The ALS driver of claim 1, wherein the reset unit comprises:

a seventh transistor comprising a gate electrode electrically connected to a reset terminal, a first electrode electrically connected to a third power terminal, and a second electrode electrically connected to the first node; and an eighth transistor comprising a gate electrode electrically connected to the reset terminal, a first electrode electrically connected to a fourth power terminal, and a second electrode electrically connected to the second node.

12. The ALS driver of claim 1, wherein the first power voltage is a high level voltage, and the second power voltage is a low level voltage.

13. An active level shift (ALS) driver comprising a plurality of ALS driving circuits, wherein each of the plurality of ALS driving circuits comprises:

an input unit configured to apply a first polarity voltage to a first node, and to apply a second polarity voltage to a second node in response to a first input signal having a voltage level being lower than a low voltage of a gate signal output from a gate driver;

a reset unit configured to apply an initial voltage to the first node and the second node, wherein the reset unit is configured to receive a reset signal;

a level compensation unit configured to compensate a voltage drop of the first node and the second node; and an output unit configured to output a first power voltage or a second power voltage according to the initial voltage and then to alternately output the first power voltage and the second power voltage according to the first polarity voltage and the second polarity voltage, wherein the ALS driver comprises only P-channel transistors;

wherein each of the plurality of ALS driving circuits further comprises a boosting unit for increasing a potential of the first node or the second node, in response to a third input signal having a second level voltage being lower than a low voltage of a gate signal output from the gate driver, and increasing a driving current of the output unit; and wherein the boosting unit comprises:

an eleventh transistor comprising a gate electrode electrically connected to a first input terminal to which the first input signal is applied, and a first electrode electrically connected to a third power terminal;

a twelfth transistor comprising a gate electrode electrically connected to the first input terminal, a first electrode electrically connected to a second electrode of the eleventh transistor, and a second electrode electrically connected to a fifth node;

a fourteenth transistor comprising a gate electrode and a first electrode electrically connected to a third input terminal to which the third input signal is applied;

a thirteenth transistor comprising a gate electrode electrically connected to the third input terminal, a first electrode electrically connected to a second electrode of the fourteenth transistor, and a second electrode electrically connected to the fifth node;

a fifteenth transistor comprising a gate electrode electrically connected to the first node, and a first electrode electrically connected to the fifth node;

a sixteenth transistor comprising a gate electrode electrically connected to the second node, and a first electrode electrically connected to the fifth node;

a first capacitor comprising a first electrode electrically connected to the third power terminal and a second electrode electrically connected to the first node;

a second capacitor comprising a first electrode electrically connected to the third power terminal and a second electrode electrically connected to the second node;

a third capacitor comprising a first electrode electrically connected to the first node and a second electrode electrically connected to a second electrode of the fifteenth transistor; and a fourth capacitor comprising a first electrode electrically connected to the second node and a second electrode electrically connected to a second electrode of the sixteenth transistor.

14. The ALS driver of claim 13, wherein the third input signal applied to the third input terminal has voltage levels of a first level voltage being the low voltage of the gate signal and of the second level voltage.

15. A liquid crystal display apparatus comprising:

a data driver connected to a plurality of data lines and configured to apply data signals to the plurality of data lines;

a gate driver connected to a plurality of gate lines and configured to sequentially apply gate signals to the plurality of gate lines;

a plurality of pixels, wherein each pixel comprises a thin film transistor (TFT) connected to one of the gate lines and one of the data lines, a first capacitor and a second capacitor connected to the TFT; and an ALS driver comprising a plurality of ALS driving circuits directly connected to a plurality of ALS lines parallel to and alternate with the gate lines, wherein each of the ALS lines is directly connected to the second capacitor, and wherein each of the ALS driving circuits comprises:

first and second nodes;

an input unit configured to apply a first polarity voltage to the first node and to apply a second polarity voltage to the second node in response to a first input signal having a level voltage being lower than a low voltage of the gate signal output from the gate driver, wherein the input unit comprises:

a first transistor comprising a gate electrode electrically connected to a first input terminal to which the first input signal is applied, and a first electrode electrically connected to a first polarity terminal to which the first polarity voltage is applied;

a second transistor comprising a gate electrode electrically connected to the first input terminal, a first electrode electrically connected to a second electrode of the first transistor, and a second electrode electrically connected to a third node;

a third transistor comprising a gate electrode electrically connected to the first input terminal, a first electrode electrically connected to the third node, and a second electrode electrically connected to the first node;

a fourth transistor comprising a gate electrode electrically connected to the first input terminal, and a first electrode electrically connected to a second polarity terminal to which the second polarity voltage is applied;

a fifth transistor comprising a gate electrode electrically connected to the first input terminal, a first electrode electrically connected to a second electrode of the fourth transistor, and a second electrode electrically connected to a fourth node; and a sixth transistor comprising a gate electrode electrically connected to the first input terminal, a first electrode electrically connected to the fourth node, and a second electrode electrically connected to the second node, wherein the first polarity voltage and the second polarity voltage have opposite polarities;

a reset unit configured to apply an initial voltage to the first and second nodes;

a level compensation unit configured to compensate a voltage drop of the first node and the second node; and an output unit configured to output a first power voltage or a second power voltage according to the initial voltage and to alternately output the first power voltage and the second power voltage according to the first polarity voltage and the second polarity voltage, wherein the ALS driver comprises only P-channel transistors.

16. The liquid crystal display apparatus of claim 15, wherein the first polarity voltage and the second polarity voltage have opposite polarities and are applied during an interval corresponding to a frame.

17. The liquid crystal display apparatus of claim 15, wherein the first input signals of the plurality of ALS driving circuits have voltage levels of a first level voltage being the low voltage of the gate signal and of a second level voltage.

18. The liquid crystal display apparatus of claim 15, wherein each of the plurality of ALS driving circuits further comprises a boosting unit for increasing a potential of the first node or the second node, in response to a second input signal having a voltage being lower than a low voltage of the gate signal output from the gate driver, and increasing a driving current of the output unit.

* * * * *